(12) United States Patent
Lee et al.

(10) Patent No.: US 7,579,821 B2
(45) Date of Patent: Aug. 25, 2009

(54) VOLTAGE GENERATOR

(75) Inventors: Kang-Seol Lee, Kyoungki-do (KR); Jae-Jin Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 335 days.

(21) Appl. No.: 11/529,255

(22) Filed: Sep. 29, 2006

(65) Prior Publication Data
US 2007/0069710 A1    Mar. 29, 2007

(30) Foreign Application Priority Data
Sep. 29, 2005 (KR) ............ 10-2005-0091587
Dec. 6, 2005 (KR) ............ 10-2005-0118144

(51) Int. Cl.
*G06F 3/16* (2006.01)
(52) U.S. Cl. .................. 323/313; 327/537; 365/203
(58) Field of Classification Search ......... 323/312–317; 327/543, 537, 530; 365/203
See application file for complete search history.

(56) References Cited

U.S. PATENT DOCUMENTS
6,721,211 B2 *    4/2004    Lee et al. ............... 365/189.09

\* cited by examiner

*Primary Examiner*—Jessica Han
*Assistant Examiner*—Emily Pham
(74) *Attorney, Agent, or Firm*—Mannava & Kang, P.C.

(57) ABSTRACT

A voltage generator includes a bias signal generator generating first to fourth bias signals using a reference voltage, the first to fourth bias signals having different voltage levels. A driving signal generator receives the first and third bias signals to generate a pull-up signal in response to a voltage level of an output terminal and receiving the second and fourth bias signals to generate a pull-down signal in response to a voltage level of the output terminal. A voltage driver pulls up and pulls down a voltage level of the output terminal in response to the respective pull-up and pull-down signals. An auxiliary driving controller disables the pull-up signal when the voltage level of the output terminal is greater than that of the reference voltage and the pull-down signal when the voltage level of the output terminal is less than that of the reference voltage.

28 Claims, 5 Drawing Sheets

VOLTAGE GENERATOR

FIELD OF THE INVENTION

The present invention relates to a voltage generator, and more particularly, to a voltage generator that can stably drive a bit line precharge voltage or cell plate voltage in a low power supply voltage condition and minimize a standby current and an operation current.

BACKGROUND

Generally, semiconductor memory devices often have low drivability due to conditions related to process changes. In such a case, drivability of a voltage is also decreased, causing a large change in internal voltages. The change in the internal voltages results in erroneous operation of semiconductor memory devices.

As semiconductor memory devices are being highly integrated, process conditions are also changing to a great extent. Thus, a core voltage decreases, and this decreasing core voltage leads to decrease in drivability of a bit line precharge voltage and a cell plate voltage.

FIG. 1 is a circuit diagram of a conventional voltage generator designed to generate a bit line precharge voltage.

The conventional voltage generator includes a core voltage controller 10 and a voltage driver 20. The core voltage controller 10 includes a core voltage generation block 11, a bias voltage generation block 12 and a gate voltage generation block 13.

The core voltage generation block 11 generates one half of a core voltage VCORE that becomes a reference voltage of a bit line precharge voltage VBLP or a cell plate voltage (not shown). The core voltage generation block 11 includes P-type channel metal-oxide semiconductor (PMOS) transistors P1 and P2 and resistors R1 and R2. The PMOS transistors P1 and P2 and the resistors R1 and R2 are connected in series between a terminal of the core voltage VCORE and a terminal of a ground voltage VSS. A reference voltage VREF is generated by a voltage divider using resistance from a self-bias diode and resistance from lines.

When a power supply voltage is supplied from an external source, the voltage divider illustrated in FIG. 1 is used to generate a power voltage. However, when the power supply voltage is generated within an internal device, the reference voltage VREF can be generated through a reference voltage generator from another apparatus.

The bias voltage generation block 12 generates bias voltages PBIAS and NBIAS using the reference voltage VREF. The bias voltage generation block 12 includes PMOS transistors P3 to P6 and N-type channel metal-oxide semiconductor (NMOS) transistors N1 to N6. The PMOS transistor P3 and the NMOS transistors N1 and N3 are connected in series between the terminal of the core voltage VCORE and the terminal of the ground voltage VSS, and thus, current consistently flows to the terminal of the ground voltage VSS. The reference voltage VREF is supplied to a gate of the PMOS transistor P3, and a gate and one terminal of the NMOS transistor N1 are connected with each other, and the same connection is applied to the NMOS transistor N3.

The PMOS transistor P4 and the NMOS transistors N2 and N4 are connected in series between the terminal of the core voltage VCORE and the terminal of the ground voltage VSS, thereby being configured as in a current mirror circuit. Due to this configuration, current flows consistently to the terminal of the core voltage VCORE. A gate and one terminal of the PMOS transistor P4 are connected with each other, and gates of the NMOS transistors N1 and N2 are connected with each other. A gate of the NMOS transistor N3 is connected with a gate of the NMOS transistor N4. Due to this connection architecture, the same current flows to the NMOS transistors N2 and N4.

The PMOS transistor P5 is connected between the terminal of the core voltage VCORE and an NMOS transistor N7. Gates of the PMOS transistors P4 and P5 are connected together, forming a current mirror circuit. The PMOS transistor P6 is connected between the terminal of the core voltage VCORE and an NMOS transistor N8, and the bias voltage PBIAS is supplied to a gate of the PMOS transistor P6. The NMOS transistor N5 is connected between the terminal of the ground voltage and the PMOS transistor P7, and the bias voltage NBIAS is supplied to a gate of the NMOS transistor N5. The NMOS transistor N6 is connected between the terminal of the ground voltage and the PMOS transistor P8, and the bias voltage NBIAS is supplied to a gate of the NMOS transistor N6.

The gate voltage generation block 13 includes the NMOS transistors N7 and N8 and PMOS transistors P7 and P8. A gate voltage NGATE is supplied to gates of the NMOS transistors N7 and N8 that are connected with each other. A gate voltage PGATE is supplied to gates of the PMOS transistors P7 and P8 that are connected commonly with each other. That is, the NMOS transistors N7 and N8 and the PMOS transistors P7 and P8 are configured as a current mirror circuit. The gate voltage generation block 13 generates the gate voltages NGATE and PGATE. The gate voltage NGATE has a voltage level greater than the reference voltage VREF by a voltage level of a threshold voltage of the NMOS transistor N7. The gate voltage PGATE has a voltage level less than the reference voltage REF by a voltage level of a threshold voltage of the PMOS transistor P7.

The voltage driver 20 includes a PMOS transistor P9 and an NMOS transistor N9. The PMOS transistor P9 and the NMOS transistor N9 are connected in series between the terminal of the core voltage VCORE and the terminal of the ground voltage VSS. A Pull-up signal PDRV and a pull-down signal NDRV are supplied to respective gates of the PMOS transistor P9 and the NMOS transistor N9. A bit line precharge voltage VBLP is output through a common terminal between the PMOS transistor P9 and the NMOS transistor N9.

FIG. 2 is a voltage waveform diagram of the conventional voltage generator illustrated in FIG. 1.

The PMOS transistor P6 operates due to a turn-on resistance whose value is close to a threshold voltage, thereby allowing current to flow consistently. Therefore, since the PMOS transistor P6 operates usually all the time, the turn-on resistance is set high. As a voltage level of the bit line precharge voltage VBLP changes, the NMOS transistor N8 operates like a source follower. Thus, the NMOS transistor N8 operates rapidly.

If a voltage level of the bit line precharge voltage VBLP decreases, voltage levels of the gate voltage NGATE of the NMOS transistor N8 and the bit line precharge voltage VBLP increase. Thus, current flows rapidly to the NMOS transistor N8, and this rapid current flow causes the voltage level of the pull-up signal PDRV to decrease. As a result, the PMOS transistor P9 turns on, resulting in increase in the voltage level of the bit line precharge voltage VBLP.

The NMOS transistor N6 operates due to a turn-on resistance whose value is close to the threshold voltage. Therefore, since the NMOS transistor N6 operates usually all the time, the turn-on resistance is set high. As a voltage level of the bit line precharge voltage VBLP changes, the PMOS transistor P8 operates like a source follower. Thus, the PMOS transistor P8 operates rapidly.

If a voltage level of the bit line precharge voltage VBLP increases, voltage levels of the gate voltage PGATE of the PMOS transistor P8 and the bit line precharge voltage VBLP increase. Thus, current flows rapidly to the PMOS transistor P8, and this rapid current flow causes the voltage level of the pull-down signal NDRV to increase. As a result, the NMOS transistor N9 turns on, resulting in decrease in the voltage level of the bit line precharge voltage VBLP.

The conventional voltage generator is used to improve the drivability. The PMOS transistor P9 and the NMOS transistor N9, having a very low threshold voltage, are included in the voltage driver 20 to increase the drivability of the last terminal. This configuration improves reading and writing operations in an active state; however, when in a precharge state, current is more likely to leak.

In detail, if a threshold voltage level of the PMOS transistor P9 is less than a target voltage level, a standby current is generated due to a large amount of the off-state leakage current. The standby current may result in negative effects. For instance, the standby current may be an issue in low power or mobile products.

Therefore, if threshold voltages of the PMOS transistor P9 and the NMOS transistor N9 are lowered to secure an operation region of the last driver terminal, the drivability can be improved, but severe damage may arise in respect of the standby current.

Also, if the bit line precharge voltage VBLP is not stable or the voltage generator operates during a standby mode, the PMOS transistor P8 operates like a source follower. Thus, the voltage driver 20 turns on fast, and turns off slowly since a minimum amount of current is supplied to reduce the standby current.

Accordingly, two points of turning on and turning off the last driver terminal are often mismatched. As a result, there may be a case that the PMOS transistor P8 and the NMOS transistor N9 turn on simultaneously, resulting in generation of a direct current.

During the operation, the standby current and the direct current are likely to be generated. Thus, a ringing current may be generated during the standby mode and the operation mode, further decreasing the drivability of semiconductor memory devices.

SUMMARY OF THE INVENTION

It is, therefore, an object of the present invention to provide a voltage generator that can stably drive a bit line precharge voltage or a cell plate voltage with a low power supply voltage and minimize a standby current and an operation current by placing PMOS and NMOS transistors that have a low threshold voltage at a driver terminal and controlling a voltage driver of the last terminal to turn on and turn off substantially for the same time.

In accordance with an aspect of the present invention, there is provided a voltage generator, including: a bias signal generator generating first to fourth bias signals using a reference voltage having a voltage level that is one half of a power supply voltage, the first to fourth bias signals having a different voltage level, the first bias signal having a voltage level greater than that of the reference voltage by a predetermined voltage level, the second bias signal having a voltage level less than that of the reference voltage by a predetermined voltage level; a driving signal generator receiving the first and third bias signals to generate a pull-up signal in response to a voltage level of an output terminal and receiving the second and fourth bias signals to generate a pull-down signal in response to a voltage level of the output terminal; a voltage driver pulling up and pulling down a voltage level of the output terminal in response to the pull-up signal and the pull-down signal, respectively; and an auxiliary driving controller disabling the pull-up signal when the voltage level of the output terminal is greater than that of the reference voltage and the pull-down signal when the voltage level of the output terminal is less than that of the reference voltage in response to the first and second bias signals and the voltage level of the output terminal.

In accordance with another aspect of the present invention, there is provided a voltage generator, including: a bias signal generator generating first to fourth bias signals using a reference voltage having a voltage level that is one half of a power supply voltage, the first to fourth bias signals having a different voltage level, the first bias signal having a voltage level greater than that of the reference voltage by a predetermined voltage level, the second bias signal having a voltage level less than that of the reference voltage by a predetermined voltage level; a driving signal generator receiving the first and third bias signals to generate a pull-up signal in response to a voltage level of an output terminal and receiving the second and fourth bias signals to generate a pull-down signal in response to a voltage level of the output terminal; a voltage driver pulling up and pulling down a voltage level of the output terminal in response to the pull-up signal and the pull-down signal, respectively; and an auxiliary driver supportively pulling up a voltage level of the output terminal when the voltage level of the output terminal is less than that of the reference voltage and pulling down a voltage level of the output terminal when the voltage level of the output terminal is greater than that of the reference voltage.

In accordance with a further another aspect of the present invention, there is provided a voltage generator, including: a bias signal generator generating first to fourth bias signals using a reference voltage having a voltage level that is one half of that of a power supply voltage, the first to fourth bias signals having a different voltage level, the first bias signal having a voltage level greater than the reference voltage by a predetermined voltage level, the second bias signal has a voltage level less than the reference voltage by a predetermined voltage level; a driving signal generator receiving the first and third bias signals to generate a pull-up signal in response to a voltage level of an output terminal and receiving the second and fourth bias signals to generate a pull-down signal in response to a voltage level of the output terminal; a PMOS transistor pulling up a voltage level of the output terminal in response to the pull-up signal; an NMOS transistor pulling down a voltage level of the output terminal in response to the pull-down signal; a first multiplexer selectively supplying one of the power supply voltage and a voltage having a voltage level greater than that of the power supply voltage as a substrate bias voltage of the PMOS transistor in response to an active signal; and a second multiplexer selectively supplying one of a ground voltage and a voltage having a voltage level less than that of the ground voltage as a substrate bias voltage of the NMOS transistor in response to the active signal.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A voltage generator in accordance with exemplary embodiments of the present invention will be described in detail with reference to the accompanying drawings.

Figure 1:
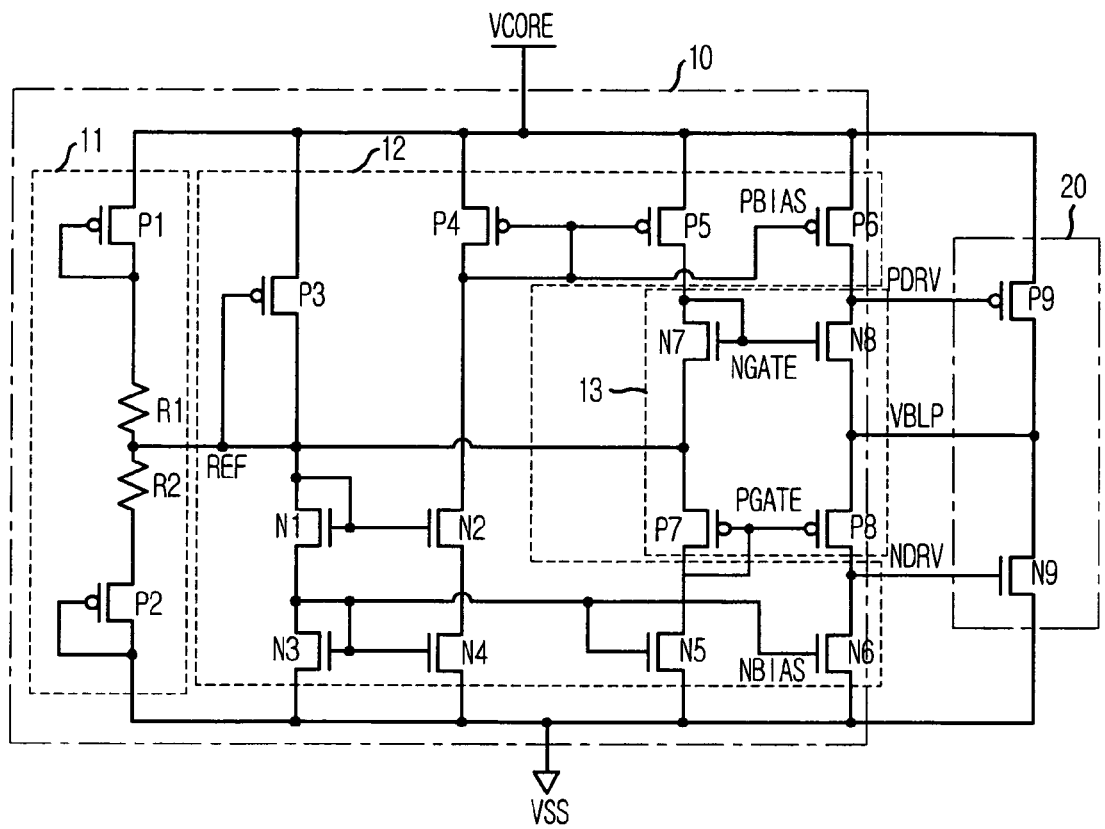
FIG. 1 is a circuit diagram of a conventional voltage generator.
Figure 2:
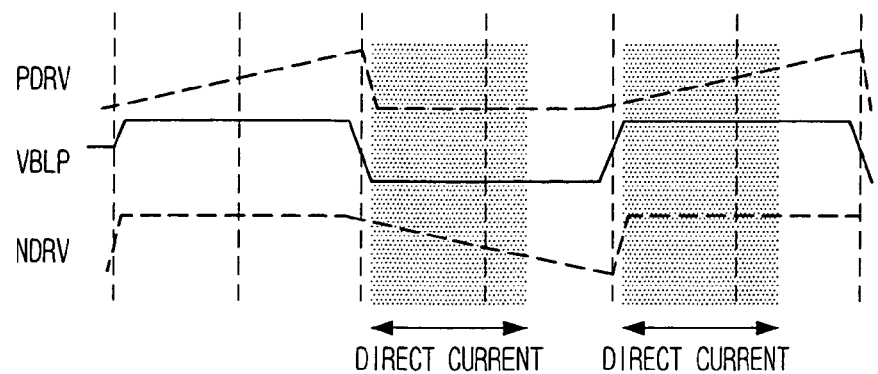
FIG. 2 is a voltage waveform diagram of the conventional voltage generator.
Figure 3:
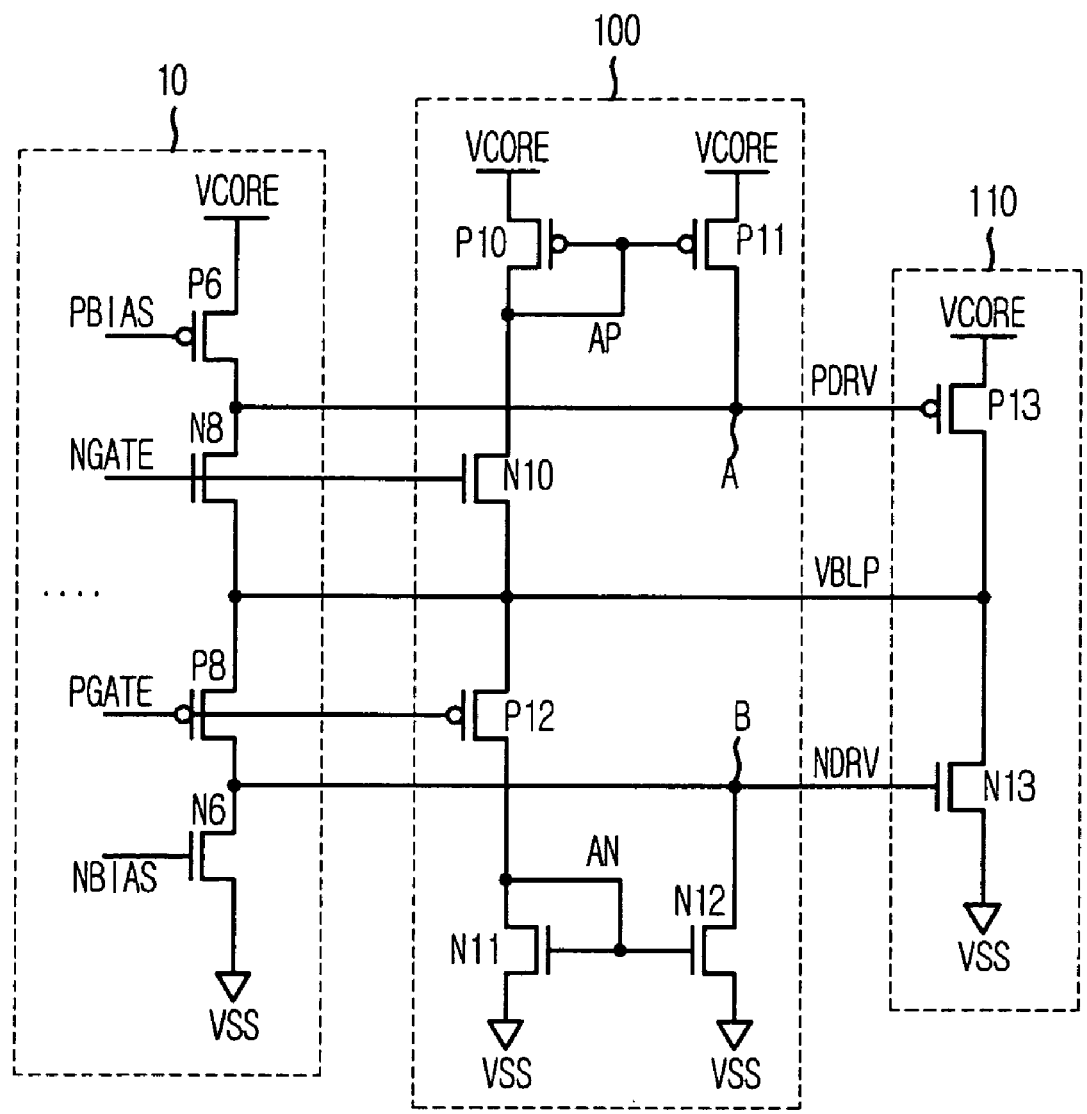
FIG. 3 is a circuit diagram of a voltage generator in accordance with an embodiment of the present invention.

FIG. 3 illustrates a circuit diagram of a voltage generator in accordance with an embodiment of the present invention. Herein, like reference numerals denote like elements described in FIG. 1.

The voltage generator includes a core voltage controller 10, an auxiliary driving controller 100 and a voltage driver 110. Since the core voltage controller 10 according to the present embodiment is substantially the same as the core voltage controller 10 described in FIG. 1, detailed description thereof will be omitted. However, for better understanding, the core voltage controller 10 in the present invention is be divided into two parts including a bias signal generator that generates four bias voltages PBIAS, NGATE, PGATE, and NBIAS and a driving signal generator that generates pull-up and pull-down signals PDRV and NDRV.

The auxiliary driving controller 100 includes PMOS transistors P10 to P12 and NMOS transistors N10 to N12. The PMOS transistor P10 is connected between a terminal of a core voltage VCORE and the NMOS transistor N10. A gate of the PMOS transistor P10 is connected with a gate of the PMOS transistor P11. The PMOS transistor P11 is connected between the terminal of the core voltage VCORE and an output node A.

The NMOS transistor N10 is connected between the PMOS transistor P10 and an output terminal for a bit line precharge voltage VBLP. The bias voltage NGATE is supplied to a gate of the NMOS transistor N10. The PMOS transistor P12 is connected between the NMOS transistor N11 and the output terminal for the bit line precharge voltage VBLP. The bias voltage PGATE is supplied to a gate of the PMOS transistor P12.

The NMOS transistor N11 is connected between a terminal of a ground voltage VSS and the PMOS transistor P12. A gate of the NMOS transistor N11 is connected with a gate of the NMOS transistor N12. The NMOS transistor N12 is connected between the terminal of the ground voltage VSS and an output node B.

The voltage driver 110 includes a PMOS transistor P13 and an NMOS transistor N13. The PMOS transistor P13 and the NMOS transistor N13 are connected in series between the terminal of the core voltage VCORE and the terminal of the ground voltage. The pull-up signal PDRV is supplied to a gate of the PMOS transistor P13, while the pull-down signal NDRV is supplied to a gate of the NMOS transistor N13. The bit line precharge voltage VBLP is output through a common terminal between the PMOS transistor P13 and the NMOS transistor N13.

Hereinafter, operation of the voltage generator according to the present invention will be described.

First, the four bias signals PBIAS, NGATE, PGATE, and NBIAS have a different voltage level. More particularly, the bias signal NGATE has a voltage level greater than that of the reference voltage by a predetermined voltage level, and the bias signal PGATE has a voltage level less than that of the reference voltage by a predetermined voltage level. The bias voltage PBIAS has a voltage level close to a voltage difference between the core voltage VCORE and a threshold voltage of a PMOS transistor P6. The bias voltage PBIAS consistently supplies a gate voltage to the PMOS transistor P6, so that a consistent amount of current flows. Also, the bias voltage NBIAS has a voltage level close to an added voltage value of the ground voltage VSS and a threshold voltage of an NMOS transistor N6. The bias voltage NBIAS consistently supplies a gate voltage to the NMOS transistor N6, so that a consistent amount of current flows.

As the bit line precharge voltage VBLP changes, an NMOS transistor N8 operates fast using the bit line precharge voltage VBLP as a source. Also, as the bit line precharge voltage VBLP changes, an NMOS transistor N8 operates fast using the bit line precharge voltage VBLP as a source. The PMOS transistor P8 and the NMOS transistor N8 that are configured in a source follower structure operate fast in response to a change in a voltage level of the bit line precharge voltage VBLP. As a result of this fast operation, the PMOS transistor P13 and the NMOS transistor N13 turn on or off.

However, since a consistent amount of current flows to the NMOS transistor N8 and the PMOS transistor P8, it takes long to turn on or off the PMOS transistor P13 and the NMOS transistor N13, which are included in the last output terminal. Hence, when the bit line precharge voltage VBLP increases, a gate source voltage of the PMOS transistor P8 also increases. Thus, a voltage level of the pull-down signal NDRV increases, and this increasing voltage level causes the NMOS transistor N13 to turn on in order to decrease the voltage level of the bit line precharge voltage VBLP.

At this time, a gate source voltage of the NMOS transistor N10 that is configured in a source follower structure decreases, and a node AP has a voltage level close to a voltage difference between the core voltage VCORE and a threshold voltage of the NMOS transistor N10. Voltage levels of the gates of the PMOS transistors P10 and P11 to which current flows consistently are controlled according to the voltage level of the node AP. As a result of the voltage level control, a voltage level of the node A rapidly increases to a voltage level of the core voltage VCORE, thereby disallowing generation of a current path.

The PMOS transistor P12, which is also configured in source follower structure, turns on more rapidly than the usual case, and thus, a voltage level of a node AC increases. According to the voltage level of the node AC, the NMOS transistors N11 and N12 turn on to decrease a voltage level of the node B. As a result, a current path is not generated.

On the other hand, if the bit line precharge voltage VBLP decreases, a gate source voltage of the NMOS transistor N8 increases. Thus, a voltage level of the pull-up signal decreases, triggering the PMOS transistor P13 to turn on to increase a voltage level of the bit line precharge voltage VBLP.

At this time, a gate source voltage of the PMOS transistor P12 that is configured in a source follower structure decreases. Thus, a node AN has a voltage level close to an added voltage value of the ground voltage VSS and a threshold voltage of the PMOS transistor P10. Hence, voltage levels of the gates of the NMOS transistors N11 and N12 to which current flows consistently are controlled according to the voltage level of the node AN, so that the voltage level of the node B decreases rapidly to a voltage level of the ground voltage VSS. As a result, a current path is not generated.

The NMOS transistor N10 that is configured in a source follower structure turns on more rapidly than the usual case, and thus, a voltage level of the node AP decreases. The PMOS transistors P10 and P11 turn on according to the voltage level of the node AP to thereby increase the voltage level of the node A. As a result, a current path is not generated.

Figure 4:
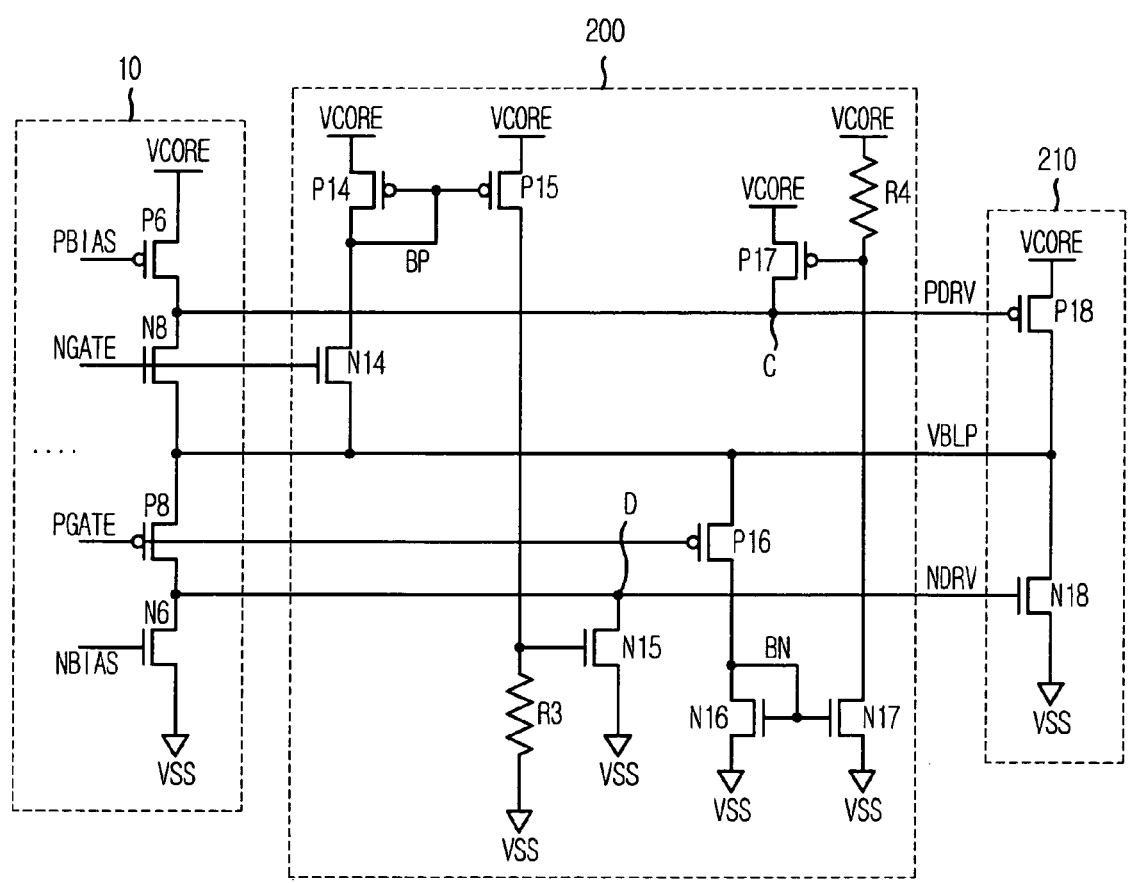
FIG. 4 is a circuit diagram of a voltage generator in accordance with another embodiment of the present invention.

FIG. 4 is a circuit diagram of a voltage generator in accordance with another embodiment of the present invention.

The voltage generator includes a core voltage controller 10, an auxiliary driving controller 200 and a voltage driver 210. Since the core voltage controller 10 according to the present embodiment is substantially the same as the core voltage controller 10 described in FIG. 1, detailed description thereof will be omitted. However, for better understanding, the core voltage controller 10 in the present invention is be divided into two parts including a bias signal generator that generates four bias voltages PBIAS, NGATE, PGATE, and NBIAS and a driving signal generator that generates pull-up and pull-down signals PDRV and NDRV.

The auxiliary driving controller 200 includes PMOS transistors P14 to P17, NMOS transistors N14 to N17 and resistors R3 and R4. The PMOS transistor P14 is connected between a terminal of a core voltage VCORE and the NMOS transistor N14. A gate of the PMOS transistor P14 is connected with a gate of the PMOS transistor P15. The PMOS transistor P15 is connected between the terminal of the core voltage VCORE and the resistor R3.

The NMOS transistor N14 is connected between the PMOS transistor P14 and an output terminal for a bit line precharge voltage VBLP. The bias voltage NGATE is supplied to a gate of the NMOS transistor N14. The resistor R3 is connected between the PMOS transistor P15 and a terminal of a ground voltage VSS. The NMOS transistor N15 is connected between a node D and the terminal of the ground voltage VSS, and a gate of the NMOS transistor N15 is connected with the resistor R3.

The PMOS transistor P16 is connected between the NMOS transistor N16 and the output terminal for the bit line precharge voltage VBLP. The bias voltage PGATE is supplied to a gate of the PMOS transistor P16. The PMOS transistor P17 is connected between the terminal of the core voltage VCORE and a node C, and a gate of the PMOS transistor P17 is connected to the resistor R4. The resistor R4 is connected between the terminal of the core voltage VCORE and the NMOS transistor N17.

The NMOS transistor N16 is connected between the terminal of a ground voltage VSS and the PMOS transistor P16. A gate of the NMOS transistor N16 is connected with a gate of the NMOS transistor N17. The NMOS transistor N17 is connected between the terminal of the ground voltage VSS and the resistor R4.

The voltage driver 210 includes a PMOS transistor P18 and an NMOS transistor N18. The PMOS transistor P18 and the NMOS transistor N18 are connected in series between the terminal of the core voltage VCORE and the terminal of the ground voltage. The pull-up signal PDRV is supplied to a gate of the PMOS transistor P18, while the pull-down signal NDRV is supplied to a gate of the NMOS transistor N18. The bit line precharge voltage VBLP is output through a common terminal between the PMOS transistor P18 and the NMOS transistor N18.

Hereinafter, operation of the voltage generator according to the present invention will be described.

First, the four bias signals PBIAS, NGATE, PGATE and NBIAS have different voltage levels. More particularly, the bias signal NGATE has a voltage level greater than that of the reference voltage by a predetermined voltage level, and the bias signal PGATE has a voltage level less than that of the reference voltage by a predetermined voltage level.

When the bit line precharge voltage VBLP increases, a gate source voltage of a PMOS transistor P8 also increases. Thus, a voltage level of the pull-down signal NDRV increases, and this increasing voltage level causes the NMOS transistor N18 to turn on to decrease a voltage level of the bit line precharge voltage VBLP.

At this time, the PMOS transistor P16, which is configured in a source follower structure, turns on rapidly, resulting in increase of a voltage level of a node BN. According to the voltage level of the node BN, the NMOS transistors N16 and N17 turn on, triggering the PMOS transistor P17 to turn on. Hence, a voltage level of the node C increases rapidly to the voltage level of the core voltage VCORE. As a result, a current path is not generated.

The NMOS transistor N14, which is configured in a source follower structure, has a gate source voltage that becomes low. As a result, the NMOS transistor N14 retains an 'off' state. At this point, the NMOS transistor N14 makes a voltage level of a node BP increase via a bootstrapping operation. Subsequently, the PMOS transistors P14 and P15 retains an 'off' state, and this retained 'off' state makes the NMOS transistor N15 remain turned off. Consequently, a current path is not generated.

On the other hand, when the bit line precharge voltage VBLP decreases, a gate source voltage of the NMOS transistor N8 increases. Therefore, the pull-up signal PDRV has a voltage level that is lowered. As a result, the PMOS transistor P18 turns on to increase the voltage level of the bit line precharge voltage VBLP.

At this time, a gate source voltage of the PMOS transistor decreases, and this decrease causes the node BN to have a voltage whose level decreases. As a result, the NMOS transistors N16 and N17 turn on to increase a gate voltage of the PMOS transistor P17, and this increasing gate voltage makes a voltage level of the node C increase. Consequently, current is not allowed to flow regardless of the voltage level of the bit line precharge voltage VBLP.

Figure 5:
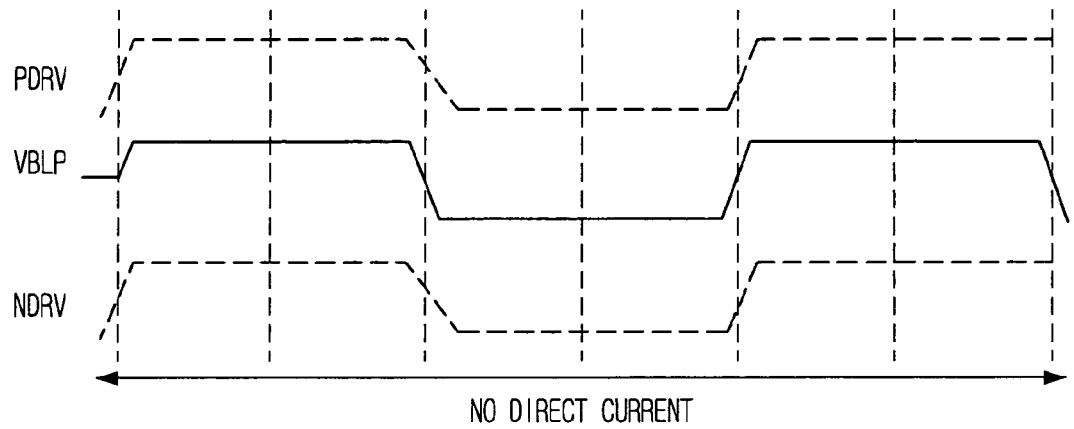
FIG. 5 is a voltage waveform diagram of the voltage generator according to the embodiment of the present invention.

The NMOS transistor N14 turns on more rapidly than the usual case, and thus, a voltage level of the node BP decreases. Also, according to the voltage level of the node BP, the PMOS transistors P14 and P15 turn on, triggering a gate voltage of the NMOS transistor N15 to increase. As a result, a voltage level of the node D decreases to a voltage level of the ground voltage VSS. Hence, a current path is not generated. In summary, FIG. 5 is a voltage waveform diagram of the voltage generators illustrated in FIGS. 3 and 4. As illustrated, a current path is not generated between those terminals for the bit line precharge voltage VBLP, the pull-up signal PDRV and the pull-down signal NDRV. Hence, the drivability of a semiconductor memory device can be improved.

Figure 6:
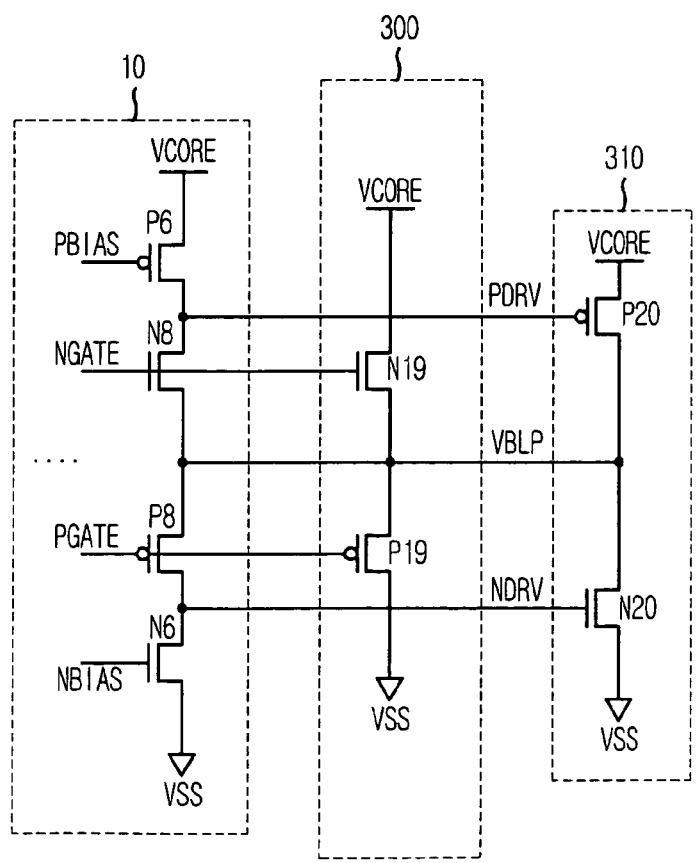
FIG. 6 is a circuit diagram of a voltage generator in accordance with still another embodiment of the present invention.

FIG. 6 is a circuit diagram of a voltage generator according to still another embodiment of the present invention.

The voltage generator includes a core voltage controller 10, an auxiliary driving controller 300 and a voltage driver 310. Since the core voltage controller 10 according to the present embodiment is substantially the same as the core voltage controller 10 described in FIG. 1, detailed description thereof will be omitted. However, for better understanding, the core voltage controller 10 in the present invention is divided into two parts including a bias signal generator that generates four bias voltages PBIAS, NGATE, PGATE, and NBIAS and a driving signal generator that generates pull-up and pull-down signals PDRV and NDRV. The four bias signals PBIAS, NGATE, PGATE, and NBIAS have different voltage levels. More particularly, the bias signal NGATE has a voltage level greater than that of the reference voltage by a predetermined voltage level, and the bias signal PGATE has a voltage level less than that of the reference voltage by a predetermined voltage level.

The auxiliary driving controller 300 includes an NMOS transistor N19 and a PMOS transistor P19. The NMOS transistor N19 and the PMOS transistor P19 are connected in series between a terminal of a core voltage VCORE and a terminal of a ground voltage VSS. The bias voltages NGATE and PGATE are supplied to respective gates of the NMOS transistor N19 and the PMOS transistor P19. A bit line precharge voltage VBLP is output through a common terminal between the NMOS transistor N19 and the PMOS transistor P19.

The voltage driver 310 includes a PMOS transistor P20 and an NMOS transistor N20. The PMOS transistor P20 and the NMOS transistor N20 is connected in series between the terminal of the core voltage VCORE and the terminal of the ground voltage VSS. The pull-up and pull-down signals PDRV and NDRV are supplied to respective gates of the PMOS transistor P20 and the NMOS transistor N20. The bit line precharge voltage VBLP is output through a common terminal between the PMOS transistor P20 and the NMOS transistor N20.

A direct current path is not generated by additionally placing the NMOS transistor N19 that has the bias voltage NGATE as an input voltage and the bit line precharge voltage VBLP as a source, and the PMOS transistor P19 that has the bias voltage PGATE as an input and the bit line precharge voltage VBLP as a source. As a result, the drivability of the voltage driver 310 can be improved.

Figure 7:
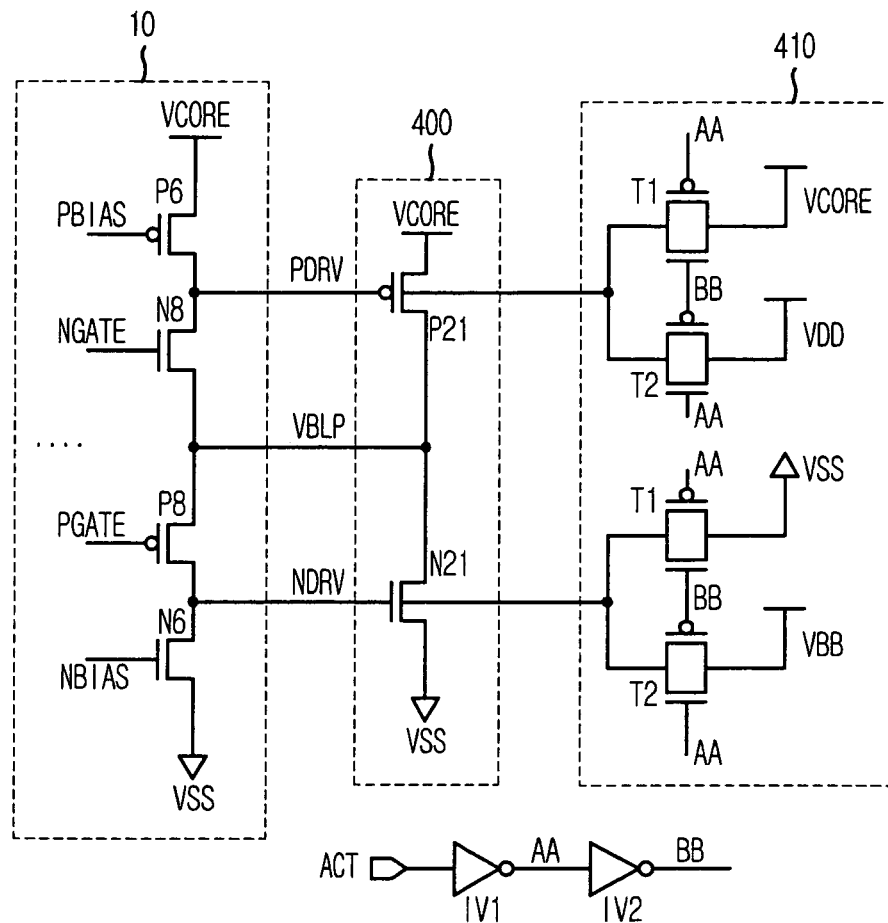
FIG. 7 illustrates a circuit diagram of a voltage generator in accordance with a further another embodiment of the present invention.

FIG. 7 is a circuit diagram of a voltage generator in accordance with a further another embodiment of the present invention.

The voltage generator includes a core voltage controller 10, a voltage driver 410 and an output controller 410. Since the core voltage controller 10 according to the present embodiment is substantially the same as the core voltage controller 10 described in FIG. 1, detailed description thereof will be omitted. However, for better understanding, the core voltage controller 10 in the present embodiment is divided into two parts including a bias signal generator that generates four bias voltages PBIAS, NGATE, PGATE, and NBIAS and a driving signal generator that generates pull-up and pull-down signals PDRV and NDRV. The four bias signals PBIAS, NGATE, PGATE, and NBIAS have different voltage levels. More particularly, the bias signal NGATE has a voltage level greater than that of the reference voltage by a predetermined voltage level, and the second bias signal PGATE has a voltage level less than that of the reference voltage by a predetermined voltage level.

The voltage driver 410 includes a PMOS transistor P21 and an NMOS transistor N21. The PMOS transistor P21 and the NMOS transistor N21 are connected in series between a terminal of a core voltage VCORE and a terminal of a ground voltage VSS. The pull-up signal PDRV and the pull-down signal NDRV are supplied to respective gates of the PMOS transistor P21 and the NMOS transistor N21. A bit line precharge voltage VBLP is output through a common terminal between the PMOS transistor P21 and the NMOS transistor N21.

The output controller 420 includes transfer gates T1 to T4. The transfer gate T1 outputs the core voltage VCORE to a bulk of the PMOS transistor P21 depending on the states of control signals AA and BB. The transfer gate T2 outputs a power supply voltage VDD to the bulk of the PMOS transistor P21 depending on the states of the control signals AA and BB.

The transfer gate T3 outputs the ground voltage VSS to a bulk of the NMOS transistor N21 depending on the states of the control signals AA and BB. The transfer gate T4 outputs a back bias voltage VBB to the bulk of the NMOS transistor N21 depending on the states of the control signals AA and BB.

The control signal AA is a signal that is inverted from an active signal ACT by an inverter INV1. The control signal BB is a signal that is inverted from the control signal AA by an inverter INV2. The transfer gates T1 and T3 receive the control signal AA through the gate of the PMOS transistor P21, and the control signal BB through the gate of the NMOS transistor N21. The transfer gates T2 and T4 receive the control signal BB through the gate of the PMOS transistor P21, and the control signal AA through the NMOS transistor N21.

Figure 8:
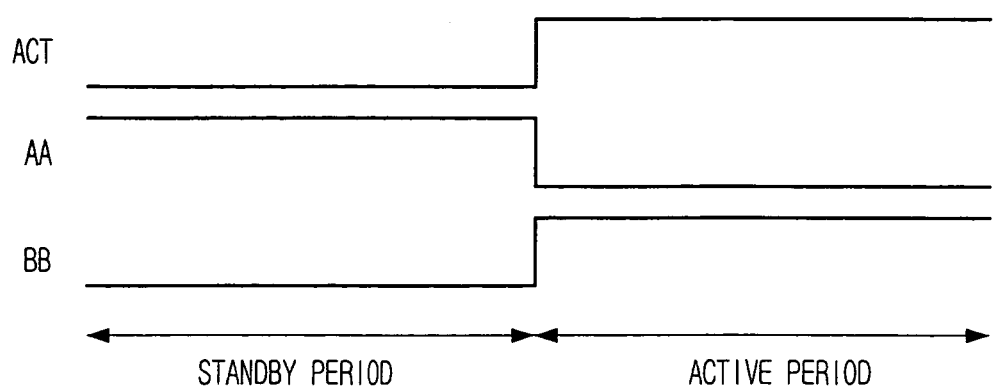
FIG. 8 illustrates an operation timing diagram of the voltage generator illustrated in FIG. 7.

FIG. 8 is an operational timing diagram of the voltage generator illustrated in FIG. 7.

When the active signal ACT is enabled during an active operation mode ACTIVE PERIOD, the control signal AA has a logic low, while the control signal BB has a logic high. Thus, the transfer gates T1 and T3 turn on to supply the core voltage VCORE to the bulk of the PMOS transistor P21 and the ground voltage VSS to the bulk of the NMOS transistor N21. Hence, during the active operation mode ACTIVE PERIOD, threshold voltage levels of the PMOS transistor P21 and the NMOS transistor N21 decrease, thereby improving the drivability of the semiconductor memory device.

On the other hand, in the case of a standby mode, when the active signal ACT is disabled, the control signal AA has a logic high, while the control signal BB has a logic low. Thus, the transfer gates T2 and T4 turn on, triggering the supply of the power supply voltage VDD and the back bias voltage VBB to the bulk of the PMOS transistor P21 and the bulk of the NMOS transistor N21, respectively. As a result, the threshold voltage levels of the PMOS transistor P21 and the NMOS transistor N21 increase, and thus, current is not likely to leak.

In other words, the bulk bias of the PMOS transistor P21 to which the core voltage VCORE is supplied as a source is controlled to be self-biased for the purpose of decreasing the threshold voltage level during the active operation mode ACTIVE PERIOD. During the standby mode STANDBY PERIOD, the back bias voltage VBB is supplied to the NMOS transistor N21 of the voltage driver 400 to increase the threshold voltage level (i.e., to decrease the leakage current).

According to various embodiments of the present invention, a bit line precharge voltage and a cell plate voltage can be supplied stably in the state of a low power supply voltage with a low core voltage, and at the same time, a standby current and an operation current can be minimized.

During an active operation mode, controlling a threshold voltage level of the voltage driver contributes to an improvement on the drivability. During a standby mode, a path where current is likely to leak is not blocked, and thus, reliability of semiconductor memory devices can be enhanced.

The present application contains subject matter related to the Korean patent application Nos. KR 2005-91587 and 2005-0118144, filed in the Korean Patent Office on Sep. 29, 2005, and Dec. 6, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A voltage generator comprising:
   a bias signal generator configured to generate first to fourth bias signals using a reference voltage having a voltage level that is one half of a power supply voltage, the first to fourth bias signals having different voltage levels, the first bias signal having a voltage level greater than that of the reference voltage by a predetermined voltage level, the second bias signal having a voltage level less than that of the reference voltage by a predetermined voltage level;
   a driving signal generator configured to receive the first and third bias signals to generate a pull-up signal in response to a voltage level of an output terminal for a bit line precharge voltage and to receive the second and fourth bias signals to generate a pull-down signal in response to a voltage level of the output terminal for the bit line precharge voltage;
   a voltage driver configured to pull up and pull down a voltage level of the output terminal in response to the pull-up signal and the pull-down signal, respectively; and
   an auxiliary driving controller configured to increase a voltage level of the pull-up signal when the voltage level of the output terminal for the bit line precharge voltage increases and to decrease the pull-down signal when the voltage level of the output terminal for the bit line precharge voltage decreases in response to the first and second bias signals and the voltage level of the output terminal for the bit line precharge voltage.

2. The voltage generator of claim 1, wherein the voltage driver comprises:
   a P-type channel metal-oxide semiconductor (PMOS) transistor having one terminal connected to a terminal of the power supply voltage, the other terminal connected to the output terminal, and a gate to which the pull-up signal is input; and
   an N-type channel metal-oxide semiconductor (NMOS) transistor having one terminal connected to a terminal of a ground voltage, the other terminal connected to the output terminal and a gate to which the pull-down signal is input.

3. The voltage generator of claim 2, wherein the driving signal generator comprises:
   a first PMOS transistor connected between the terminal of the power supply voltage and a terminal of the pull-up signal and having a gate to which the third bias signal is input, the third bias signal having a voltage level less than that of the power supply voltage by a threshold voltage level of a PMOS transistor;
   a first NMOS transistor connected between the terminal of the pull-up signal and the output terminal and having a gate to which the first bias signal is input;
   a second NMOS transistor connected between the terminal of the ground voltage and a terminal of the pull-down signal and having a gate to which the fourth bias signal is input, the fourth bias signal having a voltage level greater than the ground voltage by a threshold voltage level of an NMOS transistor; and
   a second PMOS transistor connected between the terminal of the pull-down signal and the output terminal and having a gate to which the second bias signal is input.

4. The voltage generator of claim 3, wherein the auxiliary driving controller comprises:
   a third NMOS transistor having one terminal connected to the output terminal, and a gate to which the first bias signal is input;
   a third PMOS transistor having one terminal connected to the terminal of the power supply voltage, and a gate and the other terminal commonly connected to the other terminal of the third NMOS transistor;
   a fourth PMOS transistor having one terminal connected to the terminal of the power supply voltage, the other terminal connected to the terminal of the pull-up signal and a gate connected to the other terminal of the third PMOS transistor;
   a fifth PMOS transistor having one terminal connected to the output terminal and having a gate to which the second bias signal is input;
   a fourth NMOS transistor having one terminal connected to the terminal of the ground voltage, and a gate and the other terminal commonly connected to the other terminal of the fifth PMOS transistor; and
   a fifth NMOS transistor having one terminal connected to the terminal of the ground voltage, the other terminal connected to the terminal of the pull-down signal and a gate connected to the other terminal of the fourth NMOS transistor.

5. The voltage generator of claim 3, wherein the auxiliary driving controller comprises:
   a third NMOS transistor having one terminal connected to the output terminal, and a gate to which the first bias signal is input;
   a third PMOS transistor having one terminal connected to the terminal of the power supply voltage, and a gate and the other terminal commonly connected to the other terminal of the third NMOS transistor;
   a fourth PMOS transistor having one terminal connected to the terminal of the power supply voltage, and a gate connected to the other terminal of the third PMOS transistor;
   a first resistor connected between the other terminal of the fourth PMOS transistor and the terminal of the ground voltage;
   a fourth NMOS transistor having one terminal connected to the terminal of the ground voltage, the other terminal connected to the terminal of the pull-down signal and a gate connected to the other terminal of the fourth PMOS transistor;
   a fifth PMOS transistor having one terminal connected to the output terminal, and a gate to which the second bias signal is input; and
   a fifth NMOS transistor having one terminal connected to the terminal of the ground voltage, and a gate and the other terminal commonly connected to the other terminal of the fifth PMOS transistor;
   a sixth NMOS transistor having one terminal connected to the terminal of the ground voltage, and a gate connected to the other terminal of the fifth NMOS transistor;
   a second resistor connected between the terminal of the power supply voltage and the other terminal of the sixth NMOS transistor; and
   a sixth PMOS transistor having one terminal connected to the terminal of the power supply voltage, the other terminal connected to the terminal of the pull-up signal, and a gate connected to the other terminal of the sixth NMOS transistor.

6. The voltage generator of claim 4, wherein the first bias signal has a voltage level greater than that of the reference voltage by a threshold voltage level of an NMOS transistor, and the second bias signal has a voltage level less than the reference voltage by a threshold voltage level of a PMOS transistor.

7. The voltage generator of claim 5, wherein the first bias signal has a voltage level greater than that of the reference voltage by a threshold voltage level of an NMOS transistor, and the second bias signal has a voltage level less than the reference voltage by a threshold voltage level of a PMOS transistor.

8. The voltage generator of claim 4, wherein the power supply voltage is a core voltage.

9. The voltage generator of claim 6, wherein the power supply voltage is a core voltage.

10. The voltage generator of claim 7, wherein the power supply voltage is a core voltage.

11. A voltage generator comprising:
a bias signal generator configured to generate first to fourth bias signals using a reference voltage having a voltage level that is one half of a power supply voltage, the first to fourth bias signals having different voltage levels, the first bias signal having a voltage level greater than that of the reference voltage by a predetermined voltage level, the second bias signal having a voltage level less than that of the reference voltage by a predetermined voltage level;
a driving signal generator configured to receive the first and third bias signals to generate a pull-up signal in response to a voltage level of an output terminal for a bit line precharge voltage and to receive the second and fourth bias signals to generate a pull-down signal in response to a voltage level of the output terminal for the bit line precharge voltage;
a voltage driver configured to pull up and pull down a voltage level of the output terminal in response to the pull-up signal and the pull-down signal, respectively; and
an auxiliary driver configured to supportively pull up a voltage level of the output terminal for the bit line precharge voltage when the voltage level of the output terminal for the bit line precharge voltage decreases and to pull down a voltage level of the output terminal for the bit line precharge voltage when the voltage level of the output terminal for the bit line precharge voltage increases.

12. The voltage generator of claim 11, wherein the voltage driver comprises:
a PMOS transistor having one terminal connected to a terminal of the power supply voltage, the other terminal connected to the output terminal, and a gate to which the pull-up signal is input; and
an NMOS transistor having one terminal connected to a terminal of a ground voltage, the other terminal connected to the output terminal and a gate to which the pull-down signal is input.

13. The voltage generator of claim 12, wherein the driving signal generator comprises:
a first PMOS transistor connected between the terminal of the power supply voltage and a terminal of the pull-up signal and having a gate to which the third bias signal is input, the third bias signal having a voltage level less than that of the power supply voltage by a threshold voltage level of a PMOS transistor;
a first NMOS transistor connected between the terminal of the pull-up signal and the output terminal and having a gate to which the first bias signal is input;
a second NMOS transistor connected between the terminal of the ground voltage and a terminal of the pull-down signal and having a gate to which the fourth bias signal is input, the fourth bias signal having a voltage level greater than the ground voltage by a threshold voltage level of an NMOS transistor; and
a second PMOS transistor connected between the terminal of the pull-down signal and the output terminal and having a gate to which the second bias signal is input.

14. The voltage generator of claim 13, wherein the auxiliary driver comprises:
a third NMOS transistor having one terminal connected to the output terminal, the other terminal connected to the terminal of the power supply voltage, and a gate to which the first bias signal is input; and
a third PMOS transistor having one terminal connected to the output terminal, the other terminal connected to the terminal of the ground voltage, and a gate to which the second bias voltage is input.

15. The voltage generator of claim 14, wherein the first bias signal has a voltage level greater than that of the reference voltage by a threshold voltage level of an NMOS transistor, and the second bias signal has a voltage level less than that of the reference voltage by a threshold voltage level of a PMOS transistor.

16. The voltage generator of claim 15, wherein the power supply voltage is a core voltage.

17. A voltage generator comprising:
a bias signal generator generating first to fourth bias signals using a reference voltage having a voltage level that is one half of that of a power supply voltage, the first to fourth bias signals having different voltage levels, the first bias signal having a voltage level greater than the reference voltage by a predetermined voltage level, the second bias signal has a voltage level less than the reference voltage by a predetermined voltage level;
a driving signal generator receiving the first and third bias signals to generate a pull-up signal in response to a voltage level of an output terminal and receiving the second and fourth bias signals to generate a pull-down signal in response to a voltage level of the output terminal;
a PMOS transistor pulling up a voltage level of the output terminal in response to the pull-up signal;
an NMOS transistor pulling down a voltage level of the output terminal in response to the pull-down signal;
a first multiplexer selectively supplying one of the power supply voltage and a voltage having a voltage level greater than that of the power supply voltage as a substrate bias voltage of the PMOS transistor in response to an active signal; and
a second multiplexer selectively supplying one of a ground voltage and a voltage having a voltage level less than that of the ground voltage as a substrate bias voltage of the NMOS transistor in response to the active signal.

18. The voltage generator of claim 17, wherein the power supply voltage is a core voltage, and the output terminal is a bit line precharge terminal.

19. The voltage generator of claim 18, wherein the first multiplexer comprises:
a first transfer gate outputting the core voltage during an active operation mode with control of the active signal and an inverted signal of the active signal; and
a second transfer gate outputting an external power supply voltage during a standby mode with control of the active signal and an inverted signal of the active signal.

20. The voltage generator of claim 19, wherein the second multiplexer comprises:
a third transfer gate outputting the ground voltage during the active operation mode with control of the active signal and the inverted signal of the active signal; and
a fourth transfer gate outputting a back bias voltage during the standby mode with control of the active signal and the inverted signal of the active signal.

21. A voltage generator comprising:
a core voltage controller configured to generate first to fourth bias signals based on a reference voltage and to generate pull-up and pull-down signals;
a voltage driver configured to pull down and pull up a voltage level of the bit line precharge voltage in response to the pull-up and pull-down signals, respectively;
an auxiliary driving controller configured to increase a voltage level of the pull-up signal when the voltage level of the bit line precharge voltage increases and to decrease the pull-down signal when the voltage level of the bit line precharge voltage decreases in response to the first and second bias signals and the voltage level of the bit line precharge voltage.

22. The voltage generator of claim 21, wherein the core voltage controller includes a bias signal generator configured to generate first to fourth bias signals using a reference voltage having a voltage level that is one half of a power supply voltage, and a driving signal generator configured to receive the first to fourth bias signals and to generate the pull-up signal and the pull-down signals.

23. The voltage generator of claim 22, wherein the first to fourth bias signals has different voltage levels, the first bias signal has a voltage level greater than that of the reference voltage by a predetermined voltage level, and the second bias signal has a voltage level less than that of the reference voltage by a predetermined voltage level.

24. The voltage generator of claim 22, wherein the driving signal generator receives the first and third bias signals to generate a pull-up signal in response to a voltage level of the bit line precharge voltage, and receives the second and fourth bias signals to generate a pull-down signal in response to a voltage level of the bit line precharge voltage.

25. A voltage generator comprising:
a core voltage controller configured to generate first to fourth bias signals based on a reference voltage and to generate pull-up and pull-down signals;
a voltage driver configured to pull down and pull up a voltage level of a bit line precharge voltage in response to the pull-up and pull-down signals, respectively;
an auxiliary driving controller configured to supportively pull up the voltage level of the bit line precharge voltage when the voltage level of the bit line precharge voltage increases and to pull down the voltage level of the bit line precharge voltage when the voltage level of the bit line precharge voltage decreases in response to the first and second bias signals and the voltage level of the bit line precharge voltage.

26. The voltage generator of claim 25, wherein the core voltage controller includes a bias signal generator configured to generate first to fourth bias signals using a reference voltage having a voltage level that is one half of a power supply voltage, and a driving signal generator configured to receive the first to fourth bias signals and to generate the pull-up signal and the pull-down signals.

27. The voltage generator of claim 26, wherein the first to fourth bias signals has different voltage levels, the first bias signal has a voltage level greater than that of the reference voltage by a predetermined voltage level, and the second bias signal has a voltage level less than that of the reference voltage by a predetermined voltage level.

28. The voltage generator of claim 26, wherein the driving signal generator receives the first and third bias signals to generate a pull-up signal in response to a voltage level of the bit line precharge voltage, and receives the second and fourth bias signals to generate a pull-down signal in response to a voltage level of the bit line precharge voltage.

* * * * *